Figure 1:
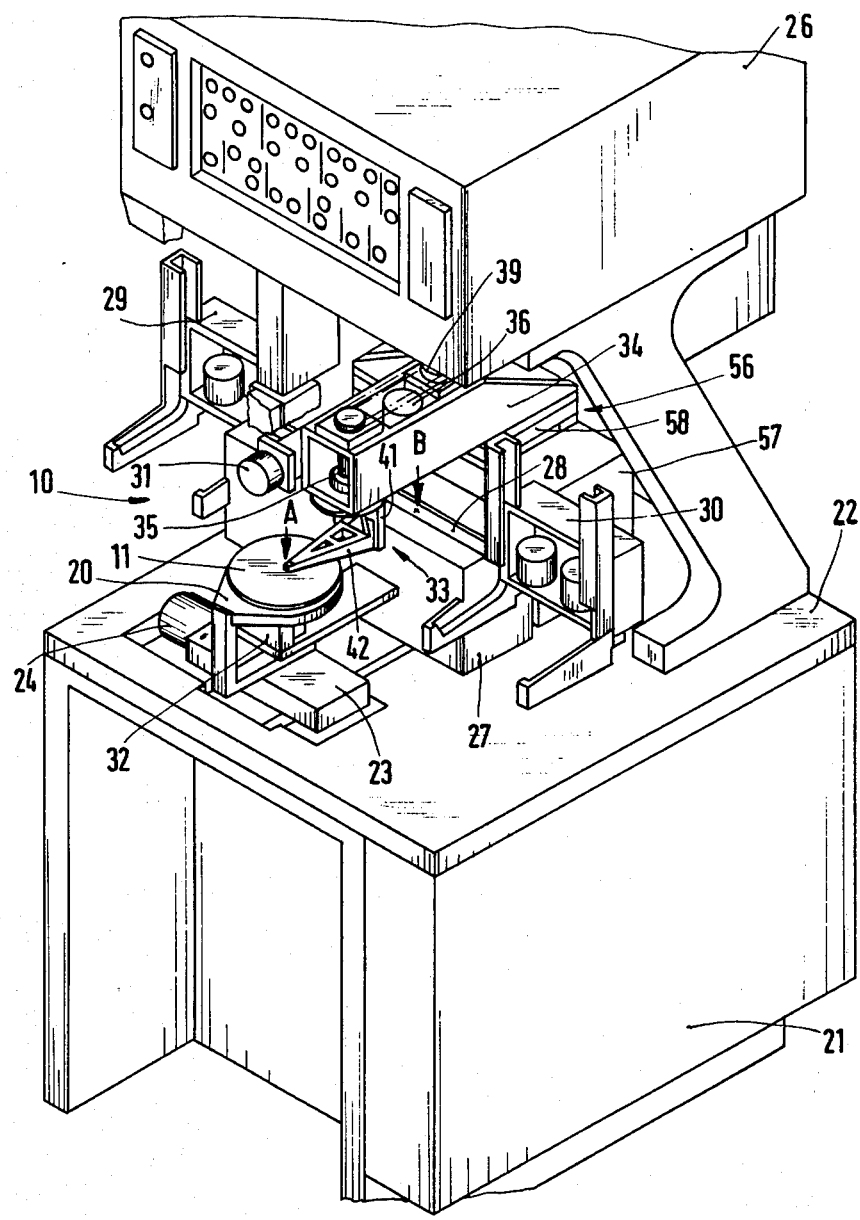

United States Patent [19]

Heim et al.

[11] 4,221,533
[45] Sep. 9, 1980

[54] APPARATUS FOR TRANSFERRING OBJECTS

[75] Inventors: Richard Heim, Moosburg; Georg Fischer, Inkofen, both of Fed. Rep. of Germany

[73] Assignee: Texas Instruments Deutschland GmbH, Freising, Fed. Rep. of Germany

[21] Appl. No.: 931,336

[22] Filed: Aug. 7, 1978

[30] Foreign Application Priority Data

May 29, 1978 [DE] Fed. Rep. of Germany ....... 2823360

[51] Int. Cl.$^3$ .............................................. B25J 9/00
[52] U.S. Cl. ............................... 414/744 B; 414/590; 414/750; 414/752
[58] Field of Search ................. 414/4, 5, 589, 590, 414/744, 750

[56] References Cited

U.S. PATENT DOCUMENTS

| | | | |
|---|---|---|---|
| 3,648,143 | 3/1972 | Harper et al. | 414/4 X |
| 3,934,731 | 1/1976 | Müller et al. | 414/749 |
| 4,005,782 | 2/1977 | Crockett | 414/750 |
| 4,119,211 | 10/1978 | Boyer et al. | 414/744 X |
| 4,146,924 | 3/1979 | Birk et al. | 414/5 X |

*Primary Examiner*—L. J. Paperner
*Attorney, Agent, or Firm*—N. Rhys Merrett; Melvin Sharp; Gary C. Honeycutt

[57] ABSTRACT

A rotary pickup arm transfers objects from a fixed pickup station to a fixed deposition station during a first part of a work cycle and is returned to the pickup station during a second part of the work cycle. The pickup arm is carried by a head having a support mounted on an X-Y table movable relative to the pickup and deposition station by step motors along X and Y axes perpendicular to the axis of rotation of the pickup arm. The X-Y table can be adjustably displaced by predetermined amounts along the X and/or Y axes during the first part of the working cycle to place an object accurately at a desired location at the deposition station and displaced by an equal and opposite amount during the second part of the working cycle to pick up a further object from the pickup station. By this means objects may be transferred from the pickup station to precise locations on a carrier at the deposition stations so that (a) misplacement of the carrier relative to the pickup station location can be compensated and/or (b) several objects may readily be located precisely at different locations on the carrier.

8 Claims, 5 Drawing Figures

APPARATUS FOR TRANSFERRING OBJECTS

The invention relates to an apparatus for transferring objects from a pickup station disposed on a frame to which the objects are brought successively to a deposition station spaced therefrom and lying on the frame, comprising a head which carries the pickup means and is moveable relatively to a head support disposed on the frame between two positions such that the pickup means is disposed in the first position at the pickup station and in the second position at the deposition station, the pickup means being controllable in such a manner that it can pick up the object disposed at the pickup station and release said object at the deposition station, controllable drive means for the movement of the head between the two positions and a main control system for the control of the drive means and the pickup means in a working cycle in whose first half-cycle the pickup means is actuated at the pickup station for picking up the object and thereafter the drive means are actuated for moving the head from the first position to second position and in whose second half-cycle the pickup means is actuated for releasing the object at the deposition station and thereafter the drive means are actuated for moving the head from the second position into the first position.

In certain areas of automated mass production it is frequently necessary to place small objects or workpieces supplied to the pickup station with great accuracy on supports or substrates brought successively to the deposition station. A known example is the fabrication of semiconductor devices such as transistors or integrated circuits which are first formed in large number on a single semiconductor slice which is subsequently cut into individual semiconductor bars. Each of these semiconductor bars must then be mounted with great accuracy on its own lead frame so that further automatic fabrication steps can be carried out, for example the attachment of connecting wires between the contact areas on the semiconductor bar and the terminals of the lead frame.

In known apparatus of other type, each semiconductor bar is placed on the lead frame at the same fixed deposition point defined by the movement of the head. It has been found that the accuracy thus obtained in positioning the semiconductor bar is not always adequate. On the one hand, it may happen that due to production tolerances in the fabrication of the lead frames or due to misadjustments of the machine the lead frames do not assume the prescribed position at the deposition station or the deposition location itself is displaced relatively to the frame. On the other hand, it may also be frequently desirable to change the position of the semiconductor bars on the lead frames, for example for adaptation to different types of semiconductor devices. For this purpose, in previous apparatus such mechanical adjustments have been made by skilled operators, which interrupts the working operations for extended period of time.

It is an object of the invention to provide an apparatus in which the necessary adjustments of the position of the transferred objects at the deposition station can be made rapidly and simply.

According to the invention this is achieved in that the head support is displaceable relatively to the base parallel to the plane in which the movement of the head takes place and that a control device is provided with which a predetermined displacement relatively to the base can be imparted to the head support during the first half-cycle and which imparts the opposite displacement to the head support during the second half-cycle.

In an apparatus according to the invention, no permanent mechanical adjustment is made; in each operating cycle the same adjustment movement is executed and then subsequently reversed. The adjustment can thus be made by low-skilled operators easily and rapidly, improved by visual observation and changed as required. The working process is hardly interrupted by the adjustments necessary. Waste is reduced because rapid adaptation to different conditions is possible at any time.

Figure 2:
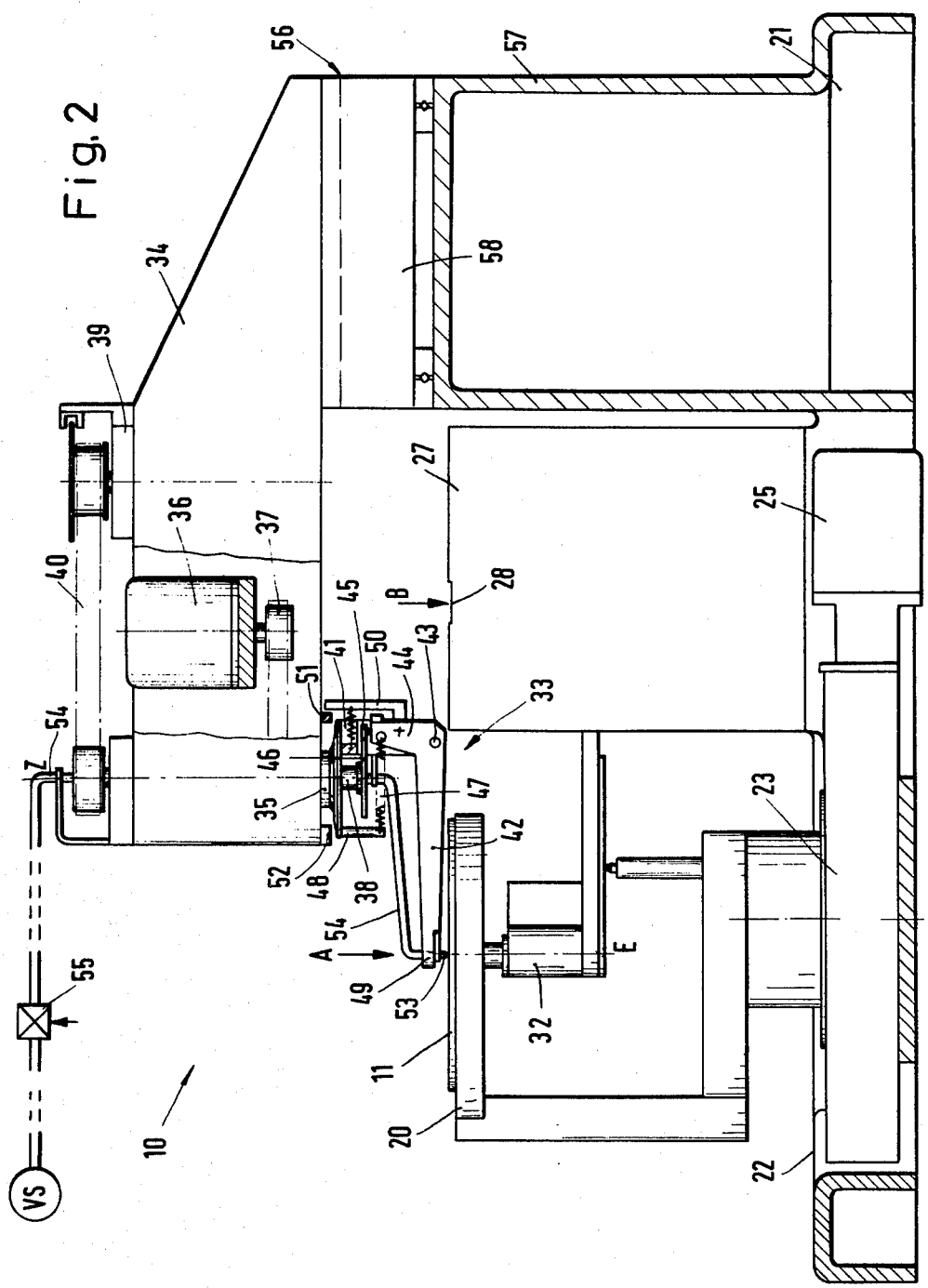
Figure 3:
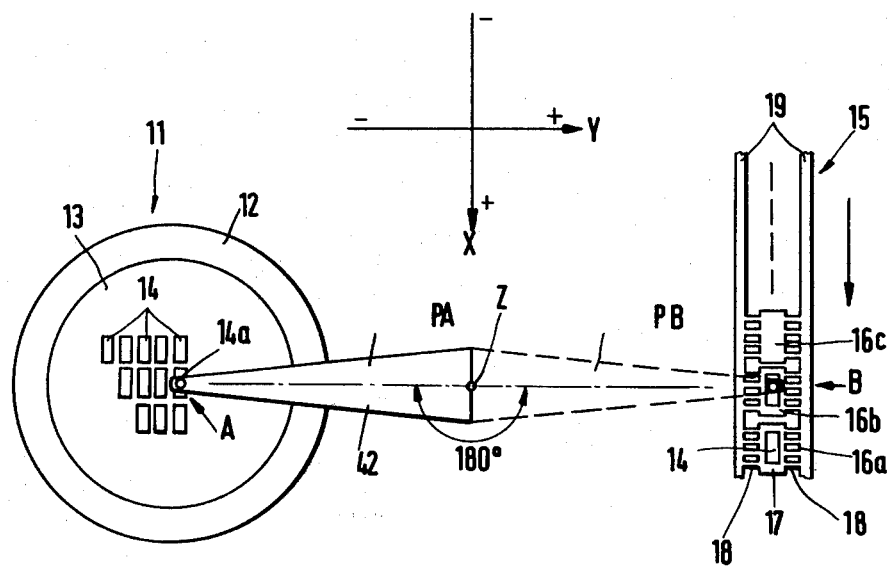
Figure 4:
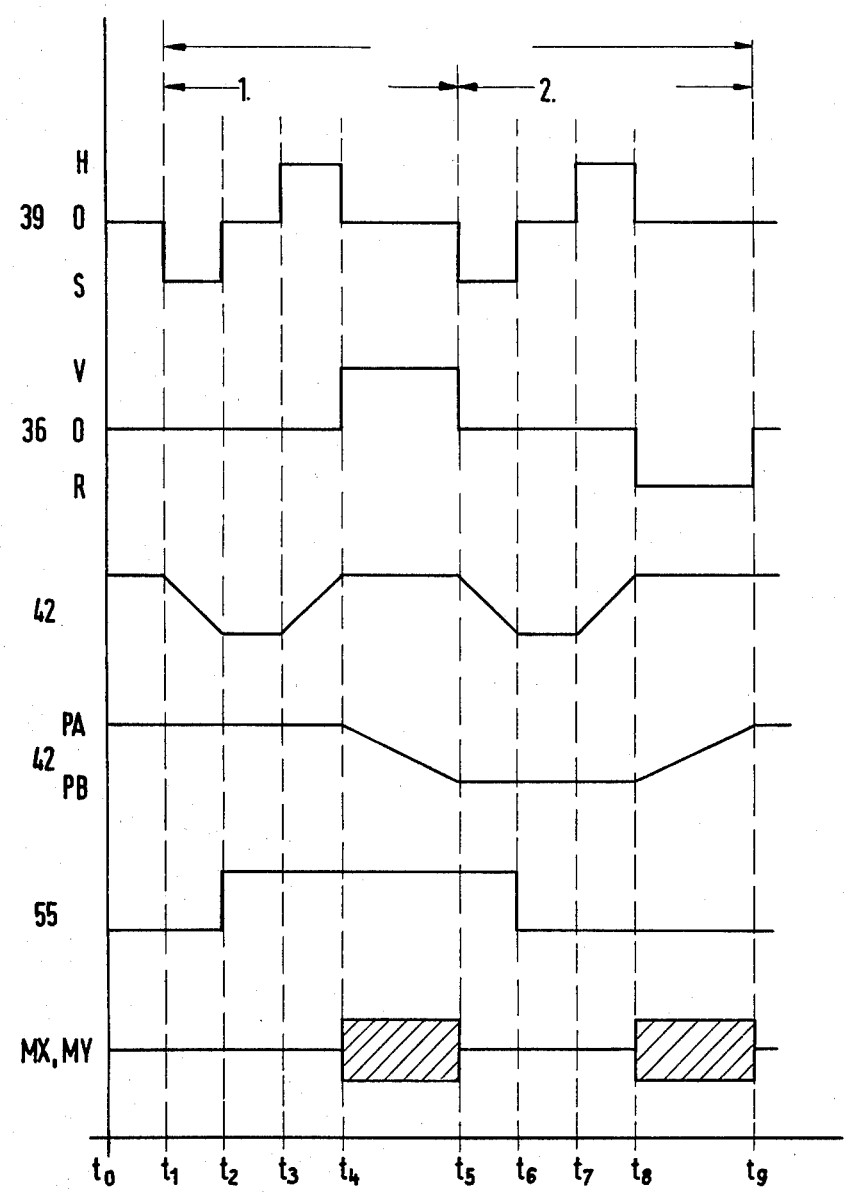
Figure 5:
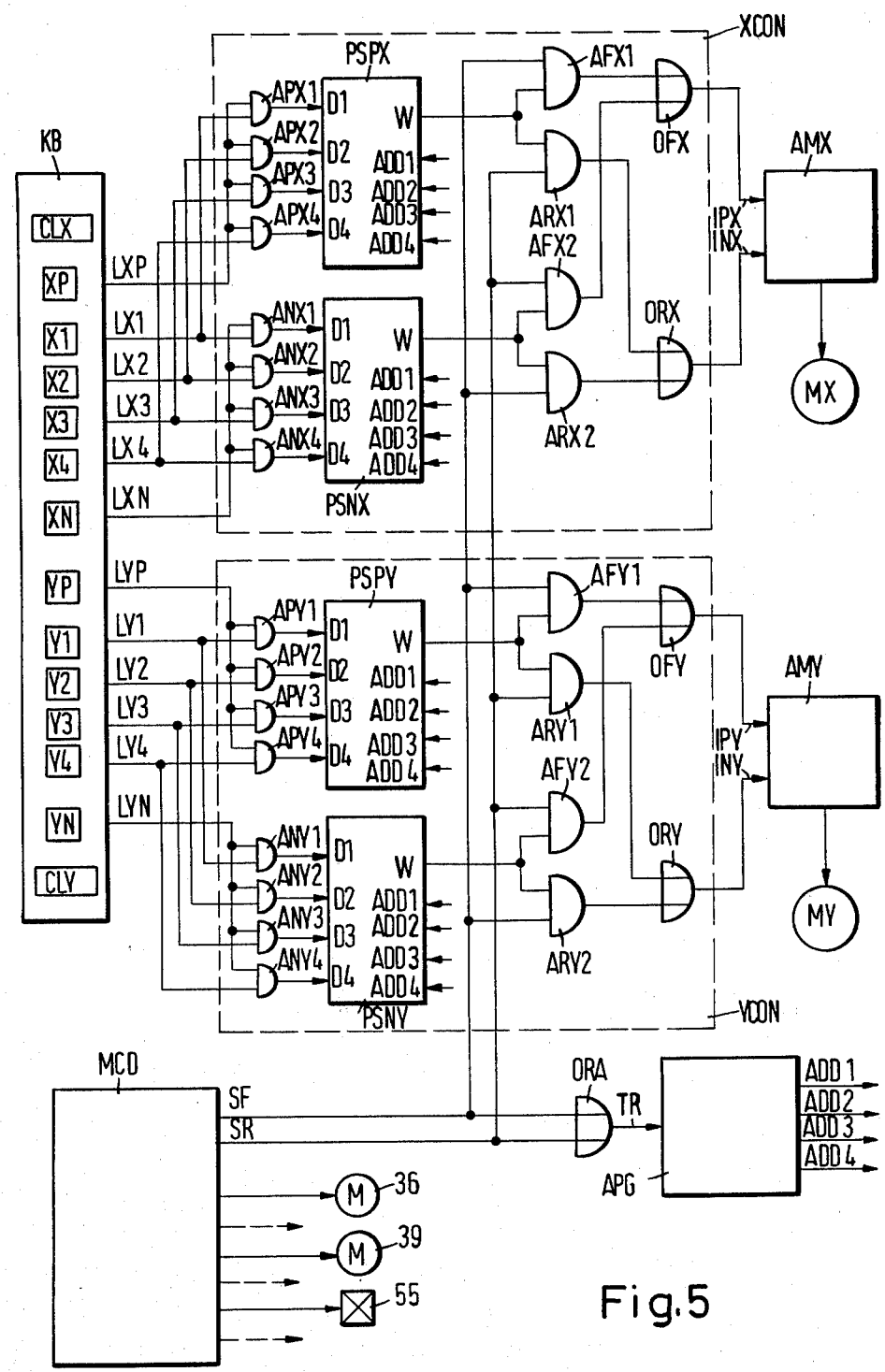

Further features and advantages of the invention will be apparent from the following description of an example of embodiment with the aid of the drawings, wherein:

FIG. 1 is a perspective view of a fabricating machine for semiconductor devices having an apparatus according to the invention, FIG. 2 is a partially sectioned side view of the upper part of the machine of FIG. 1, FIG. 3 is a schematic illustration for explaining the mode of operation of the apparatus of FIGS. 1 and 2, FIG. 4 shows time diagrams of the actuation of different components of the apparatus of FIGS. 1 and 2 and FIG. 5 is a circuit diagram of a control system for the apparatus of FIGS. 1 and 2.

FIGS. 1 and 2 of the drawings show an apparatus 10 for transferring articles used in a machine employed in fabricating semiconductor devices. It is of course usual to form a large number of semiconductor components, such as transistors or integrated circuits, simultaneously on a single semiconductor slice of small thickness and thereafter to separate said slice into the individual components, which have the form of rectangular wafers or bars. For this purpose, the semiconductor slice is adhered to a foundation in the form of a resilient plastic foil whose edge is clamped in a frame. The semiconductor slice is then separated into the individual semiconductor bars, for which the frame with the clamped foundation serves as provisional support. FIG. 3 shows diagramatically such a support 11 with a circular frame 12 in which a plastic foil 13 is mounted. Furthermore, some of the rectangular semiconductor bars 14 adhered to the plastic foil 13 are shown, the number of which in reality may be very much greater.

The semiconductor bars 14 must be removed individually consecutively from the support 11 and each bar must be mounted on its own lead frame. The lead frames are generally punched from sheet metal in such a manner that a large number thereof are held together by lateral longitudinal strips. FIG. 3 shows diagramatically a portion of such a lead frame strip 15, three lead frames 16a, 16b, and 16c being illustrated. Each lead frame 16 comprises a mounting area 17 for receiving a bar 14 and laterally projecting connection conductors 18. The ends of the connection conductors 18 are held together by the lateral longitudinal strips 19 which are subsequently cut off for severing the lead frames.

The lead frame strips 15 may be advanced stepwise along a guideway so that the individual lead frames 16 are brought successively to a point at which the individual bars 14 removed from the support 11 can be mounted thereon. The mounting may for example be effected by adhering with an epoxy resin adhesive or by alloying. The problem thus arises of removing the bars 14 consecutively from the support 11 and transferring them to the lead frames 16. This is the purpose of the apparatus 10 in the machine illustrated in FIGS. 1 and 2.

The machine comprises a frame 21 whose upper side forms a table 22 on which the different components are mounted. The table 22 carries an X-Y table 23 on which a holder 20 is mounted which accommodates interchangeably a support 11. The X-Y table 23 is driven in the usual manner by motors 24 (FIG. 1) and 25 (FIG. 2), which are preferably stepping motors, in two axial directions perpendicular to each other. By means of the X-Y table 23 the support may be adjusted stepwise in the two axial directions so that in succession each bar can be brought to a pickup station A exactly defined with respect to the frame 21. The stepping motors 24, 25 for this adjustment, like the other processes occurring in the machine, may be controlled by a main control means accommodated in the upper portion 26 of the machine. Furthermore, on the table 22 a pedestal 27 is mounted whose upper side has a guideway 28 in which the lead frame strips 15 may be intermittently advanced by an advancing means not shown in detail so that each lead frame 16 is brought in succession to a deposition station B exactly defined with respect to the frame 21 at which a bar 14 removed from the support 11 is to be deposited on the lead frame 16. The unoccupied lead frame strips 15 may be disposed in large number in magazines from which they are removed in succession and introduced into the guideway 28; the lead frame strips 15 provided with the bars 14 can thereafter again be inserted into similar magazines. For this purpose, a magazine changer 29 and 30 respectively is provided at each end of the guideway 28. The magazine changer 29 contains the magazines with the unoccupied lead frame strips 15 and the magazine changer 13 contains the magazines for receiving the lead frame strips fitted with bars. At a station disposed between the magazine changer 29 and the deposition station B there is a means 31 for applying the adhesive to the lead frames. The advancing or indexing means, the magazine changers 29, 30 and the means 31 are also controlled by the main control system accommodated in the upper part 26 in the correct timed relationship with the operation of the machine.

It is assumed in FIG. 3 that the semiconductor bar 14a is at the pickup station A. An automatic alignment means may be provided which by acting on the stepping motors 24 and 25 brings each bar at the pickup station A into an exactly defined location with respect to a reference point fixed with regard to the machine; this reference point lies for example on the axis E of a die ejector (FIG. 2) which is contained in an ejector mechanism 32 and by a vertical upward movement facilitates detachment of a picked-up semiconductor bar 14 from the plastic foil 13. The ejector mechanism 32 is fixedly connected to the frame 21 of the machine so that it does not execute the movements of the X-Y table 23.

It is further assumed in FIG. 3 that the lead frame 16b is at the deposition station B at which the bar removed from the support 11 is to be mounted on the lead frame. The lead frame 16a is already provided with a bar 14 whereas the lead frame 16c is still unoccupied and reaches the deposition station B on the next indexing step.

The apparatus 10 includes a head 33 operable to pick up a bar 14 disposed on the support 11 at the pickup station A, remove it from the support 11, transfer it to the deposition station B and place it on the lead frame 16 located at said station. The head 33 is rotatably mounted at the front end of a cantilever head support 34 for rotation about a vertical axis Z. It comprises a hollow shaft 35 which is rotatably mounted in the head support 34 and which is driven by a motor 36 via a belt drive 37. Lying inside the hollow shaft 35 coaxially with the latter is a shaft 38 which is driven at its end projecting from the hollow shaft 35 by a motor 39 via a belt drive 40. The motors 36 and 39 may also be stepping motors. At the lower end of the hollow shaft 35 a downwardly projecting lug 41 is mounted eccentrically and on said lug a horizontal arm 42 is mounted pivotally about an axis 43. The arm 42 is constructed as bellcrank lever on the upwardly projecting short leg 44 of which a roller 45 is mounted which bears on the periphery of a cam 46 carried by the shaft 38. A spring 47 secured on the one hand to the short leg 44 and on the other to a pin 48 carried by the hollow shaft 35 tends to hold the roller 45 in engagement with the cam 46. With this arrangement it is possible, by rotating the cam 46 by means of the shaft 38 relatively to the hollow shaft 34, to pivot the arm 42 about the axis 43 so that the free end 49 of the arm 42 executes an upward or downward movement. On the other hand, by rotating the hollow shaft 35 the arm 42 can be pivoted about the vertical axis of rotation; the pivot angle, which in the example illustrated is 180°, is limited by a stop member 50 which cooperates with the stops 51 and 52 mounted at the lower side of the head support 34. As a result, in its two end positions the arm 42 assumes exactly defined locations with respect to the head support 34.

The actual pickup means for the semiconductor bar 14 is formed by a capillary tube 53 which is mounted at the end 49 of the arm 42 and connected to a flexible tube 54. The flexible tube 54 follows the movement of the arm 42; it is led through the hollow inside of the shaft 38 and connected to a vacuum source VS as shown diagramatically in FIG. 2. In the connection to the vacuum source there is an electrically controllable valve 55 by which the capillary tube 53 may be selectively connected to or disconnected from the vacuum source VS. Thus, when the mouth of the capillary tube 53 is placed on a semiconductor bar 14 and the valve 55 is open a suction effect is produced by means of which the capillary tube holds the semiconductor bar.

By closing the valve 55 the vacuum is disconnected and the semiconductor bar released by the capillary tube.

The head 33 is so made and mounted on the head support 34 that in the one limit position of the arm 42, as shown in FIG. 2, the mouth of the capillary tube 53 is exactly above the reference point at the pickup station A and after rotating the arm through 180° the capillary tube 53 is brought into the other limit position at the deposition station B. These limit positions of the arm 42 are also indicated diagramatically in FIG. 3; for simplification they will be called "position PA" and "position PB".

The mode of operation of the part of the apparatus described so far will be explained with the aid of the time diagrams of FIG. 4 which show the times of the switching on of the motor 39 in the lifting direction (H) and lowering direction (S) respectively and of the motor 36 in the forward direction (V) and in the rearward direction (R), the upward and downward movement of the arm 42, the rotational movement of the arm 42 from the position PA to the position PB and back and the opening and closing of the valve 55 for one complete operating cycle. These operations are controlled by the main control system accommodated in the upper part 26 of the machine. The main control system, which is illustrated in FIG. 5 by a box MCD, furnishes the control signals for the actuation of the motors 36 and 39 and of the vacuum valve 55 in the manner illustrated in the diagrams of FIG. 4.

At the instant $t_0$ prior to start of the operating cycle the arm 42 is in the position PA and is raised so that by displacement of the support 11 a new semiconductor bar 14 can be brought to the pickup station A and exactly aligned there with the reference point. At the start of the operating cycle at the instant $t_1$ the motor 39 is driven in the lowering direction corresponding to lowering of the arm 42. The arm thus moves downwardly, the mouth of the capillary tube 53 thus being placed on the semiconductor bar 14 disposed at the pickup station A. This operation is finished at the instant $t_2$; at this instant the motor 39 is disconnected and the valve 55 simultaneously opened, placing the capillary tube 53 under vacuum. At the instant $t_3$ the motor 39 is switched on in the lifting direction and the arm 42 thereby raised. On the upward movement the capillary tube 53 carries the semiconductor bar 14 which remains adhered to the mouth of the capillary tube because of the suction effect due to the vacuum. Detachment of the semiconductor bar from the plastic foil 13 is facilitated by actuating the ejector mechanism 32 between the instants $t_2$ and $t_4$. At the instant $t_4$ the arm 42 has again reached its upper position; at this instant the motor 39 is disconnected. At the same time, at the instant $t_4$ the motor 36 is switched on in the forward direction, thus pivoting the arm 42 from the position PA to the position PB. It reaches this position at the instant $t_5$, at which the motor 36 is disconnected. At the instant $t_5$ the motor 39 is again switched on in the lowering direction so that the semiconductor bar 14 picked up and carried by the capillary tube 53 is placed on the lead frame 16 disposed at the deposition station B. As soon as the arm 42 has reached its lowermost position at the instant $t_6$ the motor 39 is disconnected. At the same time the valve 55 is closed so that the capillary tube 53 is disconnected from the vacuum source VS. As a result, the capillary tube 53 releases the semiconductor bar 14 which has been placed on the lead frame 16 previously provided with adhesive.

At the instant $t_7$ the motor 39 is again switched on in the lifting direction; as soon as the arm 42 has reached the upper position at the instant $t_8$ the motor 39 is disconnected and at the same time the motor 36 switched on in the opposite direction of rotation so that the arm 42 is pivoted back from the position PB into the position PA. When it has reached this position at the instant $t_9$ the motor 36 is disconnected and all the parts are then again in the same position as at the instant $t_0$. The same operation may be repeated as often as desired.

It is apparent that the entire operating cycle consists of two almost identical half-cycles which differ only in that the motor 36 is switched on in the first half-cycle in the forward direction and in the second half-cycle in the rearward direction. The fist half-cycle extends from the instant $t_1$ to the instant $t_5$ and the second half-cycle extends from the instant $t_5$ to the instant $t_9$.

The operations described can take place very rapidly; the entire operating cycle may be carried out in less than a second.

The apparatus described so far permits a completely automatic picking up and transfer of the semiconductor bars 14 brought to the pickup station A to the lead frames 16 brought to the deposition station B. If no other steps are taken the semiconductor bars are always placed on the lead frames 16 at the same location fixed with respect to the frame 16.

The advance of the lead frame strips 15 in the guideway 28 and the adjustment of the support 11 may take place at suitable points within the operating cycle described or alternatively in an interval following the instant $t_9$ prior to the start of the next operating cycle.

For the satisfactory fabrication of semiconductor devices the semiconductor bars must be mounted very accurately in precisely defined location on the mounting areas 17 of the lead frames 16 to enable subsequent processing operations to be carried out reliably with automatic equipment, in particular the attachment of connecting wires between the contact areas on the semiconductor bars and the terminals of the lead frame. For various reasons these conditions are not always fulfilled exactly with the apparatus so far described. Firstly, the same machine may be used to mount very different types of semiconductor components and it may be that the prescribed location of the semiconductor components on the mounting areas of the lead frames is different for different types. Furthermore, it may occur that due to production tolerances the mounting areas of the individual lead frames within the lead frame strips are not always exactly the same in different production lots. The necessary adjustments must be made by an operator after they have been recognized as essential by visual inspection, for example with the aid of a microscope or a television camera.

For this purpose, the head support 34 is not fixedly connected to the frame 21 but adjustable on a X-Y table 56 in two axial directions perpendicular to each other parallel to the plane of the table 22. The X-Y table 56 is formed by mounting a carriage 58 displaceable perpendicularly to the plane of the drawing of FIG. 2 on the top of a pedestal 57 (FIG. 2) projecting upwardly from the frame 11. The adjustment of the carriage 58 relatively to the pedestal 57 in this direction, which will be designated X direction, is by a stepping motor MX. The head support 34 is in turn mounted displaceably on the top of the carriage 58 parallel to the plane of the drawing of FIG. 2; the adjustment of the head support 34 relatively to the carriage 58 in this direction, which will be termed Y direction, is by a stepping motor MY. The stepping motors MX and MY are controlled by a control circuit which will be explained hereinafter in detail with the aid of FIG. 5. When no adjustment is necessary the stepping motors MX and MY are not actuated and the operation takes place as it would if the head support 34 were rigidly connected to the frame 21. If however an adjustment is necessary in the X direction the operator sets the size of the necessary adjustment at the control circuit and said control circuit effects that the stepping motor MX executes in the first half-cycle of each operating cycle a displacement of the X-Y table 56 corresponding to the extent of said adjustment in the corresponding X direction (positive or negative) and in the second half-cycle executes an adjustment of equal magnitude in the opposite X direction; thus, at the end of the complete operating cycle the head support has reached its original starting position again and consequently the capillary tube 53 is again exactly at the reference point of the pickup station A. On the other hand, the placing of the semiconductor bar on the lead frame at the deposition station B takes place with a displacement corresponding to the adjustment set. A similar procedure is adopted when a correction is necessary in the Y direction; the extent of this adjustment is set by the operator at the control circuit and the latter effects that in the first half-cycle of each operating cycle the stepping motor MY effects a corresponding displacement of the X-Y table 56 in the Y direction and in the second half-cycle the opposite displacement.

Finally, an adjustment can be made simultaneously in the X direction and in the Y direction, each of the two stepping motors MX and MY performing in the first half-cycle a displacement in one direction and in the second half-cycle a displacement of equal magnitude in the opposite direction so that at the end of each operating cycle the head support 34 always reassumes the original position and the mouth of the capillary tube 53 is located exactly at the reference point of the pickup station.

FIG. 5 shows an example of embodiment of the control circuit with which this effect can be achieved. In this Figure the main control device MCD is also shown which furnishes the control signals for the previously explained operation of the motors 36 and 39 and the vacuum valve 55, as well as control signals for further functions of the machine.

To set the size and direction of the necessary correction a keyboard KB is provided for the operator. For simplification, it is assumed that in each axial direction an adjustment of 1, 2, 3 or 4, steps of the respective stepping motor can be carried out. Each step of a stepping motor corresponds to an exactly defined displacement of the X-Y table 56. The keyboard KB thus has four X keys X1, X2, X3, X4, actuation of the key X1 resulting in displacement of the X-Y table 56 by one step of the stepping motor MX in the X direction, actuation of the key X2 by two steps, actuation of the key X3 by three steps and actuation of the key X4 by four steps. Furthermore, two X direction keys XP and XN are provided; actuation of the XP means that the displacement set by means of one of the keys X1, X2, X3, X4 is to take place in the positive X direction whilst actuation of the key XN means that the displacement is to take place in the negative X direction. An X clear key CLX serves to cancel a previously set value for the adjustment in the X direction.

In the same manner, for the adjustment in the Y direction four Y keys Y1, Y2, Y3, Y4, two Y direction keys YP and YN and a Y clear key CLY are provided.

Associated with the keys X1, X2, X3, X4 are four output lines LX1, LX2, LX3, LX4, the circuit being such that on actuation of the key X1 an output signal appears on the line LX1 and remains even after release of the key; on actuation of the key X2 the two output lines LX1 and LX2 are energised, on actuation of the key X3 the three output lines LX1, LX2, LX3 and finally on actuation of the kex X4 all four output lines LX1, LX2, LX3, LX4. Associated with the four Y keys Y1, Y2, Y3, Y4 are four lines LY1, LY2, LY3, LY4 which are energised in the same manner by actuation of the keys. Associated with the direction keys XP, XN, YP, YN is in each case a line LXP, LXN, LYP and LYN respectively; on actuation of a direction key the associated line is energised and remains energised even after release of the key.

For controlling the stepping motor MX a control circuit XCON is provided which furnishes at two outputs the necessary control pulses for the drive of the stepping motor MX in the one or in the other direction. The outputs of the control circuit XCON are connected to the two inputs IPX and INX of a motor control amplifier AMX which on the basis of the control pulses supplied thereto generates the current pulses necessary for the actuation of the stepping motors MX with the necessary strength and polarity. For each control pulse supplied to the input IPX the stepping motor MX executes a step in the positive X direction and for each control pulse supplied to the input INX a step in the negative X direction. In the same manner, for the Y stepping motor MY a control circuit YCON is provided whose outputs are connected to the inputs IPY and IMY of a motor control amplifier AMY and supply to said inputs the necessary control pulses for the rotation of the stepping motor MY in the positive or negative Y direction.

The control circuit XCON receives the output signals of the keyboard KB on the lines LX1, LX2, LX3, LX4, LXP, LXN and the control circuit YCON receives the output signals of the keyboard KB on the lines LY1, LY2, LY3, LY4, LYP, LYN. The internal structure of these two control circuits and their mode of operation are completely identical; thus, hereinafter only the structure and mode of operation of the control circuit XCON will be described in detail.

The control circuit XCON includes a first group of four AND circuits APX1, APX2, APX3, APX4, and a second group of four AND circuits ANX1, ANX2, ANX3, ANX4. The first inputs of the four AND circuits APX 1 to APX4 are connected jointly to the line LXP whilst their second inputs are each connected to one of the lines LX1, LX2, LX3, LX4. The first inputs of the AND circuits ANX1 to ANX4 are jointly connected to the line LXN whilst their second inputs are each connected to one of the lines LX1, LX2, LX3, LX4.

The outputs of the four AND circuits APX1 to APX4 are connected to the four signal inputs D1, D2, D3, D4 of a decoder PSPX which also has four address inputs ADD1, ADD2, ADD3, ADD4 and is made in known manner such that when a pulse is supplied to an address input the signal at the associated signal input D1, D2, D3, D4 is transmitted to the output W.

The outputs of the four AND circuits ANX1 to ANX4 are connected in similar manner to the four signal inputs D1, D2, D3, D4 of a decoder PSNX. The address inputs ADD1 to ADD4 of all four decoders in the two control circuits XCON and YCON are connected to the correspondingly designated outputs of an address pulse generator APG; for clarity these connections are not shown in FIG. 5 but are indicated by arrows. The address pulse generator APG is so designed that when a signal is present at its trigger input TR it emits in sequence at predetermined intervals a pulse at each of its outputs ADD1, ADD2, ADD3, ADD4.

The output W of the decoder PSPX is connected to an input of two AND circuits AFX1 and ARX1 and in the same manner the output W of the decoder PSNX is connected to an input of two AND circuits AFX2 and ARX2. The outputs of the two AND circuits AFX1 and AFX2 are connected to the two inputs of an OR circuit OFX whose output is connected to the input IPX of the motor drive circuit DMX. The outputs of the AND circuits ARX1 and ARX2 are connected to the two inputs of an OR circuit ORX whose output is connected to the input INX of the motor control amplifier AMX.

The main control system MCD has two additional outputs SF and SR. It furnishes at the output SF a signal for the duration of a period in which it provides a control signal to the motor 36 for drive in the forward direction, i.e. between the instants $t_4$ and $t_5$ in the first half-cycle of each operating cycle; it furnishes at the output SR a signal during the period in which it supplies a control signal to the motor 36 for the drive in the reverse direction, i.e. between the instants $t_8$ and $t_9$ in the second half-cycle of each operating cycle. The second inputs of the two AND circuits AFX1 and ARX2 are connected to the output SF of the main control system MCD and the two inputs of the two AND circuits ARX1 and AFX 2 are connected to the output SR of the main control system MCD. Thus, the two AND circuits AFX1 and ARX2 are enabled in each half-cycle between the instants $t_4$ and $t_5$ and the two AND circuits ARX1 and AFX2 are enabled in the second half-cycle between the instants $t_8$ and $t_9$. The outputs SF and SR of the control device MCD are further connected to the two inputs of an OR circuit ORA to the output of which the trigger input TR of the address pulse generator APG is connected.

The parts of the control circuit YCON are connected in the same manner; they are designated with the same reference numerals as the corresponding parts of the control circuit XCON, the letter X merely being replaced by the letter Y.

To explain the mode of operation of the circuit of FIG. 5 it will be assumed that an operator has visually observed that an adjustment of the location of each semiconductor bar when deposited on the lead frame is necessary by three steps in the positive X direction, no adjustment being required in the Y direction. The operator therefore actuates the key X3 and XP on the keyboard after erasing any previously stored information by actuating the keys CLX and CLY. Due to the actuation of the key XP the line LXP carries a signal by which the four AND circuits APX 1 to APX4 in the control circuit XCON are enabled whilst the AND circuits ANX1 to ANX4 remain disabled because the line LXN carries no signal. Due to the actuation of the key X3 the three lines LX1, LX2, LX3 carry a signal but these signals can only be transmitted via the AND circuits APX1, APX2, APX3 because the AND circuits ANX1, ANX2, ANX3, to which the signals are also applied, are disabled. Thus, signals are permanently applied to the signal inputs D1, D2, D3 of the decoder PSPX in the control circuit XCON whereas no signals are present at the signal inputs of the decoder PSNX of said control circuit.

In the control circuit YCON all the AND circuits APY1-4, ANY1-4 are disabled but this is of no relevance because the lines LY1 to LY4 do not carry any signals either. The decoders PSPY and PSNY in the control circuit YCON thus receive no input signals.

In each operating cycle triggered and controlled by the main control system MCD the output SF furnishes in the first half-cycle between the instants $t_4$ and $t_5$ a signal which on the one hand opens the AND circuits AFX1 and ARX2 and on the other hand triggers the address pulse generator APG via the OR circuit ORA. The address pulse generator thus furnishes in succession four pulses to the inputs ADD1, 2, 3, 4 of all four decoders but these address inputs are effective only for the decoder PSPX because no input signals are present at the other three decoders. On the basis of the address pulses supplied, at the output W of the decoder PSPX three pulses appear in succession which correspond to the signals applied to the inputs D1, D2, D3 of said decoder. These three pulses are applied via the AND circuit AFX1 and the OR circuit OFX to the input IPX of the motor control amplifier AMX and as a result the stepping motor MX executes three steps in the positive X direction during the intervals $t_4$-$t_5$ of the first half-cycle. This corresponds exactly to the desired adjustment so that the semiconductor bar transferred to the deposition station B is in the desired corrected location for deposition on the lead frame.

In the following second half-cycle the output SR of the main control system MCD furnishes between the instants $t_8$ and $t_9$ a signal which enables the AND circuits ARXL and AFX2 whilst the AND circuits AFX1 and ARX2 remain diabled because the output SF does not furnish a signal in the second half-cycle. The output signal at the output SR again triggers the address pulse generator APG via the OR circuit ORA and the four address pulses of said generator are again effective only for the decoder PSPX which thus furnishes three pulses in the same manner as in the first half-cycle. However, these three pulses are now applied via the AND circuit ARX1 and the OR circuit ORX to the input INX of the motor control amplifier AMX so that the stepping motor AMX executes three steps in the negative X direction. The displacement in the X direction effected in the first half-cycle is thereby exactly offset and at the end of the second half-cycle the head is therefore again exactly in the original position in which the mouth of the capillary tube 53 is at the reference point of the pickup station A.

The same operation is repeated in all the following operating cycles so that all the semiconductor bars are placed on their lead frames with a displacement through three steps in the positive X direction until the operator recognizes the necessity of a new correction and sets correspondingly modified values at the keyboard KB.

If however the operator observes that an adjustment in the negative X direction is required, for example by two steps, he presses (after clearing the previously stored information) the keys XN and X2 so that the lines LXN, LX1 and LX2 now carry signals.

Only the AND circuits ANX1 to ANX4 are now enabled and signals are applied only to the inputs D1 and D2 of the decoder PSNX The operations previously described are repeated with the difference that the four address pulses furnished by the address pulse generator APG are effective only for the decoder PSNX so that the latter furnishes two pulses at the output W in each half-cycle. The pulses furnished between the instants $t_4$ and $t_5$ of the first half-cycle are transmitted via the AND circuit ARX2 and the OR circuit ORX to the input INX of the motor control amplifier AMX so that the stepping motor MX executes two steps in the negative X direction. This corresponds to the desired adjustment of the position of the semiconductor bar on deposition on the lead frame.

In the second half-cycle the two pulses furnished at the output W of the decoder PSNX go through the AND circuit AFX2 and the OR circuit OFX to the input IPX of the motor control amplifier so that the stepping motor MX executes two adjustment steps in the positive X direction. As a result, the displacement made in the first half-cycle is offset. At the end of the operating cycle the head is therefore disposed in the start position again in which the mouth of the capillary tube 53 is exactly at the reference point of the pickup station A.

The same operations take place in the control circuit YCON when the operator actuates the corresponding keys for a correction in the positive or negative Y direction.

Finally, displacements may also be made simultaneously in the positive or negative X direction and in the positive or negative Y direction. The displacements made by the two stepping motors MX and MY are then superimposed and the head support with the head is adjusted along the resultant of these two movements. It is apparent that in this case as well at the end of the operating cycle the head is always returned to its original starting position.

The intervals provided for the execution of the adjustment steps by the stepping motors MX and/or MY are shown by hatched areas in FIG. 4.

The control circuit illustrated in FIG. 5 is a greatly simplified embodiment for explaining the mode of operation. In particular, the number of adjustment steps which may be executed by the stepping motors MX and MY in each cycle may be made substantially higher. It is then not expedient to provide a separate key on the keyboard for each adjustment step; the number of adjustment steps may for example be introduced in a decimal code with the aid of a decimal keyboard, the keyboard then including the corresponding code converter and memory circuits for converting the numerical values introduced into signals which can be processed by the correspondingly enlarged control circuits XCON and YCON.

Finally, it is also possible to use instead of the described digital circuits for controlling the stepping motors MX and MY for executing the adjustment correction movements a programme-controlled arrangement which supplies the necessary control signals to the inputs of the two stepping motors.

As already mentioned, the adjustment of the head support 34 by means of the X-Y table 56 may be utilized to intentionally change the location of the semiconductor bars 14 on the lead frames 16. It is thereby also possible with the apparatus described to mount two or more semiconductor bars on the same lead frame, as is necessary in many integrated circuits. In order for example to mount two semiconductor bars on one lead frame using the circuit arrangement of FIG. 5, the keyboard signals indicating the adjustment steps of the stepping motors MX and MY necessary for reaching the correct location of the one or other semiconductor bar on the lead frame are stored intermediately in suitable manner. During the transfer of each semiconductor bar the keyboard signals associated therewith are applied to the inputs of the control circuits XCON and YCON. This change may be controlled by the main control system MCD. The lead frame remains stationary during the transfer of the two semiconductor bars to the deposition station B; an indexing of the lead frame strip takes place only after every other operating cycle of the head 33. The two semiconductor bars are placed on the lead frame at two different locations but are picked up at the same pickup station A to which they may be brought successively by corresponding displacement of the support 11. When using a programme-controlled control system the same function may be achieved with suitable programming.

Furthermore, the adjustability of the head support 34 by means of the X-Y table 56 may also be utilized to impart to the semiconductor bar 14 after placing on the lead frames 16 a reciprocating or circular rubbing motion. This is desirable in particular when the semiconductor bars are secured to the lead frame not by adhering but by alloying. For this purpose, by a corresponding control circuit or corresponding programming of a programme-controlled arrangement after deposition of the semiconductor bar, i.e. between the instants $t_6$ and $t_7$ in FIG. 4, corresponding control pulses are supplied to the stepping motors MX and/or MY so that said motors execute alternately steps in both directions which impart to the head the desired reciprocal or circular motion.

The apparatus described is not restricted to the use of a head mounted rotatably on the head support. The same apparatus may also be used with a head which is reciprocated linearly, the head support then being the guideway normally fixedly mounted on the frame, but in this case to be mounted on an X-Y table.

What we claim is:

1. Apparatus for transferring objects from a pickup station disposed on a base to which the objects are brough successively to a deposition station spaced therefrom on the base, comprising head means carrying a pickup means for movement between two positions relative to a head support disposed on the base such that the pickup means is disposed in the first position at the pickup station and in the second position at the deposition station, said pickup means controllable to pick up an object disposed at the pickup station and release said object at the deposition station, controllable drive means for movement of the head between said two positions and a main control system for the control of the drive means and the pickup means in a working cycle in whose first halfcycle the pickup means is actuated at the pickup station for picking up the object and thereafter the drive means is actuated for moving the head from the first position to the second position and in whose second half-cycle the pickup means is actuated for releasing the object at the deposition station and thereafter the drive means is actuated for moving the head from the second position into the first position, wherein the head support is adjustably displaceable relatively to the base parallel to the plane in which the movement of the head takes place and a control device means for automatically imparting a predetermined but variable displacement relative to the base to the head support during the first half-cycle to adjust the location of the pickup means when in the second position, and an opposite and equal displacement to the head support during the second half-cycle.

2. Apparatus according to claim 1, wherein the head support is mounfted on X-Y table means displaceable relatively to the base in two axial directions perpendicular to each other.

3. Apparatus according to claim 2, including stepping motor means for displacing the X-Y table means in each said axial direction, and wherein the control device for each predetermined displacement in an axial direction in the first half-cycle of each operating cycle initiates the execution of a corresponding number of steps by the associated stepping motor in one direction and in the second half-cycle of each operating cycle initiates the execution of the same number of steps in the opposite direction.

4. Apparatus according to claim 1, including means mounting the head on the head support for rotation about a vertical axis and wherein said drive means rotates the head by a predetermined angle between two positions which correspond to the first and second positions.

5. Apparatus according to claim 4, wherein said predetermined angle is 180°.

6. Apparatus including pickup means carried by a hed rotatable about a vertical axis for transferring objects from a pickup position on a base to a deposition position spaced from the pickup position on said base during a working cycle including a first part during which said pickup means is rotated from the pickup position to the deposition position and a second part during which the pickup means is rotated from the deposition position to the pickup position; means operable to effect said rotation of the pickup means; said head mounted on head support means carried by X-Y table means adjustably displaceable relative to the base along each of mutually perpendicular X and Y axes in a plane perpendicular to said vertical axis; and control means automatically operable to impart a predetermined but variable displacement to said X-Y table means along either or both of said X and Y axes during said first part of the working cycle to adjust the location of the pickup means when in the deposition position and an equal and opposite displacement during the second part of the working cycle.

7. Apparatus according to claim 6, including respective stepping motor means operable for displacing said X-Y table means along said X and Y axes respectively in response to stepping drive pulses received by said stepping motors.

8. Apparatus according to claim 6, wherein said pickup means includes an arm projecting from said head in a plane parallel to the plane of displacement of the X-Y table means and pivotable about an axis parallel to one of said X and Y axes; and means for pivoting said arm towards and away from said pickup position to pickup an object at said pickup position and for pivoting said arm towards and away from said deposition position to deposit an object at said deposition position.

* * * * *